United States Patent [19]

Balopole

[11] 4,158,181
[45] Jun. 12, 1979

[54] DUAL CLOCK LOGIC SYSTEM FOR CHARGE-COUPLED DEVICE DRIVER CIRCUIT

[75] Inventor: Harvey L. Balopole, Little Neck, N.Y.

[73] Assignee: Fairchild Camera and Instrument Corporation, Mountain View, Calif.

[21] Appl. No.: 892,705

[22] Filed: Apr. 3, 1978

[51] Int. Cl.² .................. H03B 3/04; H03B 5/08; H03K 1/17
[52] U.S. Cl. ........................... 331/55; 307/269; 328/73; 331/117 R; 331/167; 331/173
[58] Field of Search ............ 331/47, 46, 50–56, 331/117 R, 167, 173, 172; 307/269; 328/72, 73

[56] References Cited

U.S. PATENT DOCUMENTS

| | | | |
|---|---|---|---|
| 3,099,712 | 7/1963 | Meacham | 307/269 X |
| 3,215,947 | 11/1965 | Loughlin et al. | 331/55 X |
| 3,369,190 | 2/1968 | Pope | 331/55 X |
| 4,119,916 | 10/1978 | Berke | 328/73 X |

*Primary Examiner*—Siegfried H. Grimm
*Attorney, Agent, or Firm*—Alan H. MacPherson; Robert C. Colwell

[57] ABSTRACT

A logic system for charge-coupled device driver circuits includes a master oscillator for driving system logic circuits, which in turn generate signals for the non-bit-rate clock circuits. In addition, the system logic circuits generate a command which resets and synchronizes a separate resettable bit-rate oscillator to drive the bit-rate logic circuits which generate bit-rate clock waveforms. By maintaining separate oscillators for bit-rate and non-bit-rate functions, the logic system substantially reduces noise and therefore results in a clearer image from CCD area imaging array.

8 Claims, 2 Drawing Figures

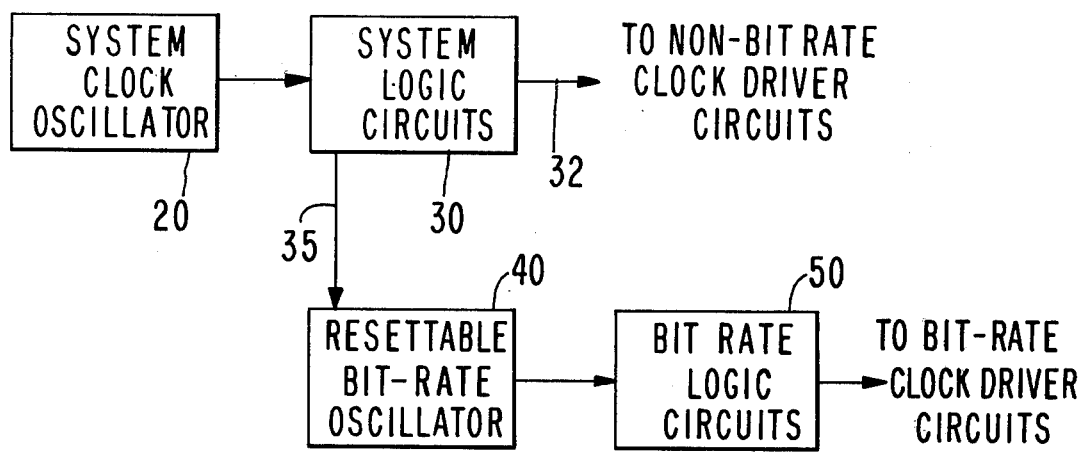
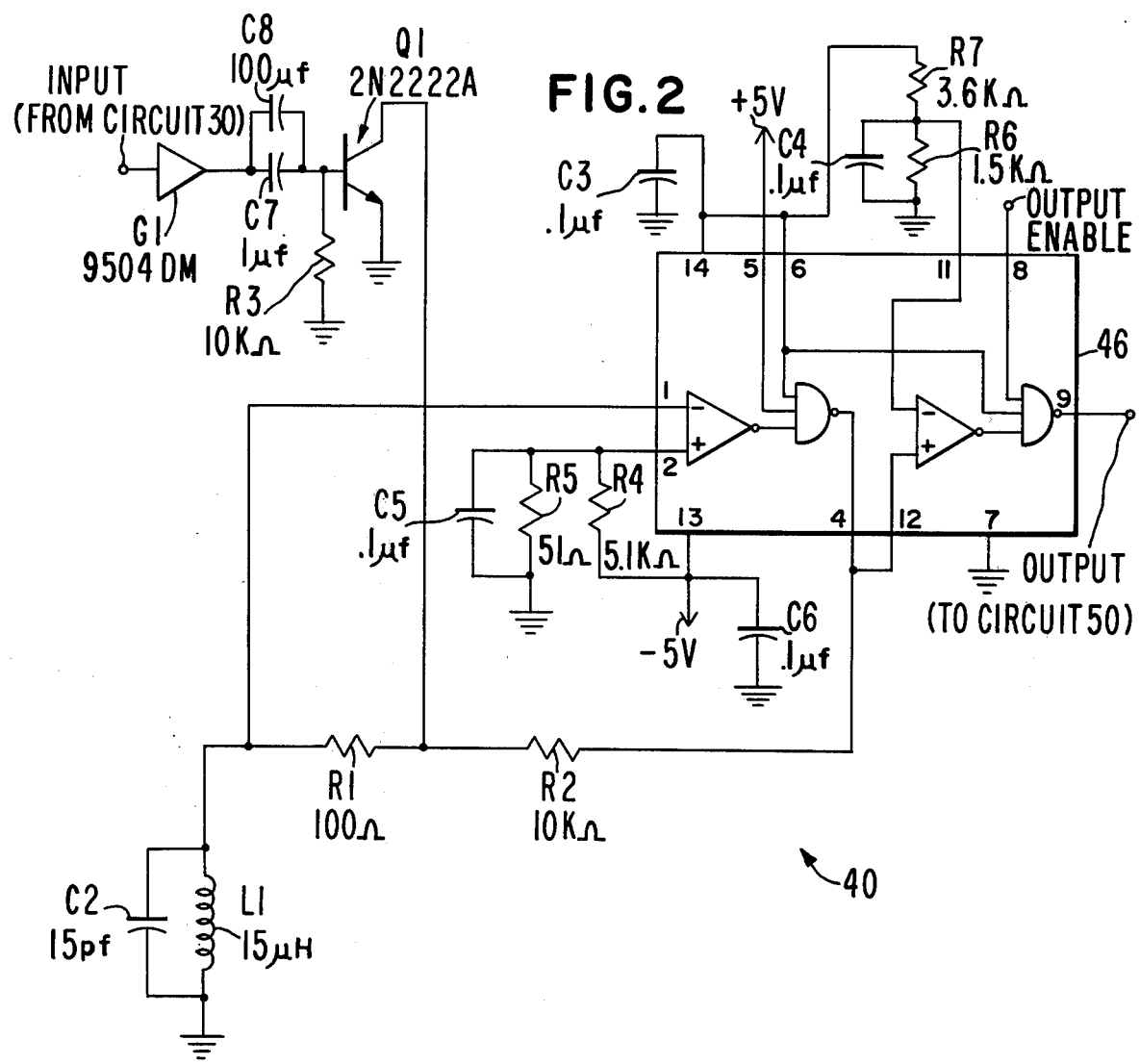

DUAL CLOCK LOGIC SYSTEM FOR CHARGE-COUPLED DEVICE DRIVER CIRCUIT

BACKGROUND OF THE INVENTION

1. Field of the Invention

This invention relates to systems utilizing chargecoupled devices, and to the clocking circuits and systems used to control the operation of charge-coupled devices. The invention relates particularly to a dual clock logic system for charge-coupled device area image sensors.

2. Description of the Prior Art

Charge-coupled semiconductor devices were first invented by W. S. Boyle and G. E. Smith (see their paper, "Charge-Coupled Semiconductor Devices," Bell Systems Technical Journal, Vol. 49, Page 587, and U.S. Pat. No. 3,858,232). Since that time the development of charge-coupled devices (also referred to as CCD's) has been described in numerous publications. See, e.g., the article by Gilbert F. Amelio, "Charge-Coupled Devices," Scientific American, February 1974, Vol. 230, No. 2, at Page 23, and C. H. Sequin and M. F. Tompsett, *Charge Transfer Devices,* Academic Press, 1975. Charge-coupled devices have been used in numerous applications, for example, as memories, analog delay lines, and image sensors.

Information is processed in most CCD's by the use of transport or shift registers. These registers transfer and manipulate packets of charge, usually groups of electrons, representative of analog or digital information. The CCD ultimately produces an output signal for use or interpretation by a signal processing circuit. Examples of CCD's operating in the general manner described above are the Fairchild Camera and Instrument Corporation (herein Fairchild) products CCD 464, a 65k bit memory, and CCD 201, an area image sensor.

The process of electron transfer along a CCD shift register typically is controlled by a set of externally generated clock signals. Such clock signals also generally are required to control and synchronize associated circuits which detect, amplify, or otherwise process the information represented by the packets of electrons. The frequency of the clocking signals applied to the shift register determines the throughput rate for the particular device operation. Therefore, a number of these signals applied to the CCD will be at the information output rate, or bit-rate. Other signals, however, will be at lower frequencies. The specific relationship between the other signals and the bit-rate signals is determined by the particular CCD organization. For example, a signal applied to the transfer gate of a 256 element linear image sensor such as the Fairchild product CCD 110 will occur only once every 256 bit-rate signals. The transfer gate signal for the Fairchild product CCD 121, a 1728 linear image sensor, will occur at a much lower frequency, that is, only once every 1728 bit-rate signals.

It is well known in the CCD art that for low noise operation the bit-rate signals must be generated carefully, and with a high regard for noise content, because the bit-rate signals may inject noise directly into the information signal, that is, directly into the on-chip detector through capacitive coupling. Typical CCD systems of the past have utilized a single master clock oscillator, the frequency emanating from which was divided by logic counters to produce a bit-rate signal and further divided to produce other lower frequency signals. Unfortunately, this prior art approach invariably produced cross-talk between the bit-rate signals and the lower frequency signals due to the repetitive binary "footprint" of the counting process. The result was a bit-rate signal which contained repetitive digital noise, and therefore, introduced this noise into the information siganl.

In CCD area imaging applications certain factors have mandated the use of the above-described scheme in which logic circuits divide the frequency of a master clock oscillator to generate bit rate and lower frequency signals. For example, in a television compatible system where certain specified waveforms must be generated, a TV sync generator integrated circuit, such as Fairchild product 3262 is used to generate certain complex synchronization signals for display of video information. This approach, however, has been unsatisfactory as it substantially increases the amount of digital clock noise in the video signal. The periodic nature of the noise introduced by the counting circuits causes such noise to appear as a series of regularly spaced vertical lines across the face of the display apparatus, for example, a television monitor. This noise was distracting to anyone desiring to view the monitor, and reduced the resolution of the entire system.

Accordingly, it is an object of this invention to provide a system for generating bit-rate signal for CCD control in which the bit-rate frequency is generated independently of all other system timing signals. It is a further object of this invention that the bit-rate generator be in synchronization with the lower frequency clocking signals to maintain proper alignment of the displayed image.

SUMMARY OF THE INVENTION

This invention overcomes the above-described difficulties of prior art CCD clocking circuits by providing a dual clock logic system for the CCD driver circuits. According to the invention, an oscillator is used to drive a series of system logic circuits which generate the non-bit-rate clock signals. The same system logic circuits, however, also generate a reset command which is used to control a resettable bit-rate oscillator. The bit-rate oscillator, in turn, may then be used to drive a series of bit-rate logic circuits which generate bit-rate clock signals for various circuits. In this manner the resettable bit-rate oscillator is connected to the system logic circuits only when the reset command occurs. By appropriate system design this reset command can be made to occur during periods in which the system is not active. For example, in area imaging applications the reset command may occur at the end of each line of video display on a TV monitor. Thus the resettable bit-rate oscillator is connected to the system logic circuits during the "blanking" period, that is, the time in which the electron beam is sweeping from the end of one line to the beginning of the next. The TV sync generator integrated circuit may still be used, and will not produce the original digital interference problem encountered with the prior art approach. Thus the desirability of having an existing LSI device doing the complex signal generation, e.g., composite sync signal, is not lost.

A further advantage of the invention is that the bit-rate frequency may be altered independently of the lower frequency clocking signals or circuits. Prior art circuits suffered the disadvantage of having the relationship between the bit-rate signals determined and fixed at the time of system design due to the digital nature of the bit-rate signal. According to the invention, the bit-rate (or information rate) may be varied without changing the system clock.

The invention is applicable to the design of logic circuitry for almost all CCD based systems. The invention affords increased flexibility and enhanced resolution for area and linear imaging sensor CCD's as well as signal processing CCD's.

BRIEF DESCRIPTION OF THE DRAWING

FIG. 1 is a block diagram of one embodiment of the invention.

FIG. 2 is a schematic diagram of a resettable bit-rate oscillator.

DETAILED DESCRIPTION

A logic system for charge-coupled device driver circuits which separates the bit-rate logic circuits from the non-bit-rate logic circuits is shown in FIG. 1. As depicted in FIG. 1 a system clock oscillator 20 generates a system clock signal which is supplied to the system logic circuits 30. The system clock oscillator 20 is typically a crystal controlled oscillator, and is available commercially from many sources, for example Motorola part K1091A, Monitor part 870A series, or MF Electronics part 5406.

The clock signal from oscillator 20 is supplied to a desired group of logic circuits 30. The system logic circuits will be a function of the type of charge-coupled device being utilized and the particular format desired. These circuits will typically be TTL or CMOS family integrated circuit devices. In one embodiment the system logic circuits comprise a plurality of serially connected counters which divide the clock signal from oscillator 20 to a desired lesser frequency which is supplied to the non-bit-rate clock driver circuits as indicated by arrow 32. At desired intervals depending upon the function desired the system logic circuits 30 will supply a reset signal indicated by arrow 35 to a resettable bit-rate oscillator 40. For example, in a television compatible system utilizing a CCD area array, the reset signal to oscillator 40 will be supplied during the blanking period which follows each horizontal scan on the face of the TV monitor.

The resettable bit-rate oscillator 40 controls the bit-rate logic circuits 50, which in turn, supply signals to the bit-rate clock driver circuits. The bit-rate logic circuits 50 are well known in the art, and like the system logic circuits 30, are a function of the type of charge-coupled device utilized and the format required. Typically the bit-rate logic circuits will be TTL or CMOS integrated circuit devices.

A schematic diagram of one embodiment of the resettable bit-rate oscillator 40 is shown in FIG. 2. As shown in FIG. 2 the circuit includes a plurality of resistors, capacitors, an inductor, and a circuit 46. Circuit 46 is a commercially available integrated circuit, for example, Signetics part 521. The pin numbers for this part are shown within the interior of rectangle 46.

As shown in FIG. 2 the input signal from circuit 30 is supplied to an inverter G1. Prior to receiving this signal circuit 40, as shown in FIG. 2, has been generating an output signal to circuit 50 at the bit-rate in the following manner. The first comparator in device 46, in conjunction with R1, R2, L1, C2 and the network connected to pin 2 of device 46 comprises an oscillator whose frequency is determined by the value of L1 and C2. This circuit will continue to oscillate if undisturbed.

When the reset signal from circuit 30 is supplied to the input of circuit 40 transistor Q1 saturates. This causes the junction of resistors R1 and R2 to be pulled down to ground potential. This action breaks the feedback loop of the oscillator and oscillations cease.

When the reset signal is removed, current flows into the LC combination and oscillations resume.

Below each of the components shown in FIG. 2 is a value or type for that component. For example, in one embodiment resistor R2 is a 10,000 ohm resistor.

What is claimed is:

1. A system for generating a bit-rate and a non bit-rate signal for controlling a charge coupled area imaging device and synchronizing the bit-rate signals with the non bit-rate signals, the system comprising:
   master oscillator means for generating a master frequency signal;
   logic circuit means connected to the master oscillator means for deriving the non bit-rate signal and a periodic reset signal from the master frequency signal; and
   resettable oscillator means for generating the bit-rate signal, the resettable oscillator means being connected to the logic circuit means to receive therefrom only the periodic reset signal, the periodic reset signal initiating the generation of the bit-rate signal by the resettable oscillator means to synchronize it with the non bit-rate signal, the resettable oscillator means including an inductor-capacitor circuit which oscillates at the frequency of the bit-rate signal except when the periodic reset signal is applied.

2. A system as in claim 1 wherein the resettable oscillator means is a resettable oscillator.

3. A system as in claim 2 wherein the inductor-capacitor circuit comprises a capacitor connected in parallel with an inductor.

4. A system as in claim 3 wherein the inductor and capacitor are connected in parallel between ground and a first node.

5. A system as in claim 4 wherein the periodic reset signal switchably connects one of ground and a voltage supply to the first node.

6. A system as in claim 5 wherein the periodic reset signal is applied to the base of a transistor, the emitter of the transistor being connected to ground and the collector being connected to the first node.

7. A system as in claim 1 wherein the master oscillator means is a crystal controlled oscillator.

8. A system as in claim 1 wherein the logic circuit means comprise at least one counter.

* * * * *